(12) United States Patent
Takahira et al.

(10) Patent No.: US 10,320,147 B2
(45) Date of Patent: Jun. 11, 2019

(54) WAVELENGTH CONVERSION MEMBER AND LIGHT EMITTING DEVICE

(71) Applicant: SHARP KABUSHIKI KAISHA, Sakai, Osaka (JP)

(72) Inventors: Yoshiyuki Takahira, Kizugawa (JP); Koji Takahashi, Sakai (JP); Yoshinobu Kawaguchi, Sakai (JP); Kazunori Annen, Sakai (JP); Yosuke Maemura, Sakai (JP); Tomohiro Sakaue, Sakai (JP); Takatoshi Morita, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/757,746

(22) PCT Filed: May 12, 2016

(86) PCT No.: PCT/JP2016/064123
§ 371 (c)(1),
(2) Date: Mar. 6, 2018

(87) PCT Pub. No.: WO2017/043122
PCT Pub. Date: Mar. 16, 2017

(65) Prior Publication Data
US 2019/0052052 A1 Feb. 14, 2019

(30) Foreign Application Priority Data
Sep. 8, 2015 (JP) .................................. 2015-176748

(51) Int. Cl.
*F21K 9/64* (2016.01)
*H01S 5/06* (2006.01)
(Continued)

(52) U.S. Cl.
CPC .............. *H01S 5/0609* (2013.01); *F21K 9/64* (2016.08); *H01S 5/02296* (2013.01); *H01S 5/32341* (2013.01); *F21Y 2115/30* (2016.08)

(58) Field of Classification Search
CPC ..................................................... H01S 5/0609
See application file for complete search history.

(56) References Cited

U.S. PATENT DOCUMENTS

| 4,992,699 A * | 2/1991 | McClure ................. C30B 29/06 |
| | | 216/25 |
| 7,476,895 B2 * | 1/2009 | Namba ................... C30B 25/02 |
| | | 257/52 |

(Continued)

FOREIGN PATENT DOCUMENTS

JP 2010-251686 A 11/2010

OTHER PUBLICATIONS

Y. Du, C. Shao, Y. Dong and Q. Yang, "Electroluminescent Properties of WLEDs With the Structures of Ce:YAG Single Crystal/Blue Chip and Sr2Si5N8:Eu2+/Ce:YAG Single Crystal/Blue Chip," Journal of Display Technology, vol. 12, No. 4, pp. 323-327, Apr. 2016 . (Year: 2016).*

*Primary Examiner* — Rhonda S Peace
(74) *Attorney, Agent, or Firm* — ScienBiziP, P.C.

(57) ABSTRACT

A wavelength conversion member that includes a single crystal phosphor and has a high yield rate is provided. A light emitting unit (1) is a wavelength conversion member that converts a wavelength of a laser light output from a laser light source and includes a phosphor layer (1a) formed of a single crystal phosphor. A plane orientation of a principal plane (1b), which has an area larger than those of divided planes, of the phosphor layer is {111}, and a plane orientation of some divided planes out of the plurality of divided planes is {1-10}.

8 Claims, 7 Drawing Sheets

(51) Int. Cl.
*H01S 5/022* (2006.01)
*H01S 5/323* (2006.01)
*F21Y 115/30* (2016.01)

(56) References Cited

U.S. PATENT DOCUMENTS

| | | | | |
|---|---|---|---|---|
| 8,556,437 | B2* | 10/2013 | Miyake | F21V 7/22 |
| | | | | 362/84 |
| 8,854,725 | B2* | 10/2014 | Hamada | G03B 21/14 |
| | | | | 359/326 |
| 8,872,208 | B2* | 10/2014 | Kawakami | G02F 1/00 |
| | | | | 257/98 |
| 8,979,314 | B2* | 3/2015 | Maemura | H01L 33/507 |
| | | | | 362/259 |
| 9,187,842 | B2* | 11/2015 | Nakajima | C03C 17/001 |
| 9,366,397 | B2* | 6/2016 | Owada | F21V 29/505 |
| 9,458,379 | B2* | 10/2016 | Hirosaki | C09K 11/7706 |
| 10,139,055 | B2* | 11/2018 | Inoue | F21V 29/74 |
| 2010/0246159 | A1 | 9/2010 | Wada | |
| 2018/0347785 | A1* | 12/2018 | Kawaguchi | F21S 2/00 |

\* cited by examiner

WAVELENGTH CONVERSION MEMBER AND LIGHT EMITTING DEVICE

TECHNICAL FIELD

The present invention relates to a wavelength conversion member that converts a wavelength of an excitation light and a light emitting device that includes the wavelength conversion member.

BACKGROUND ART

In recent years, light emitting devices have been proposed each of which includes a light emitting element such as a laser diode (LD) as a light source and projects an illumination light generated by radiating an excitation light output from the light emitting element on a light emitting unit including a phosphor.

For example, Patent Literature 1 discloses a light emitting device that includes a semiconductor laser element and a phosphor material adjacent to the semiconductor laser element. In the light emitting device, the phosphor material that has received a laser light of the semiconductor laser material emits a light with a wavelength different from that of the laser light. Patent Literature 1 further discloses that using a single crystal phosphor material enables more stable light emission.

CITATION LIST

Patent Literature

PTL 1: Japanese Unexamined Patent Application Publication No. 2010-251686 (disclosed on Nov. 4, 2010)

SUMMARY OF INVENTION

Technical Problem

It is difficult, however, to process a single crystal, depending on the type of the phosphor material. With this, there is a problem in that, when a single crystal is used for a wavelength conversion member, the yield rate of the wavelength conversion member is lowered. Patent Literature 1 does not mention this problem or a solution thereof.

The invention of the present application aims to provide a wavelength conversion member that includes a single crystal phosphor and has a high yield rate.

Solution to Problem

To solve the problem described above, a wavelength conversion member according to an aspect of the present invention is a wavelength conversion member that converts a wavelength of an excitation light output from an excitation light source and includes a phosphor layer formed of a single crystal phosphor. A plane orientation of an upper plane, which has an area larger than those of side planes, of the phosphor layer is {111}. A plane orientation of some side planes out of the plurality of side planes is {1-10}.

Furthermore, a wavelength conversion member according to an aspect of the present invention is a wavelength conversion member that converts a wavelength of an excitation light output from an excitation light source and includes a phosphor layer formed of a single crystal phosphor. A plane orientation of an upper plane, which has an area larger than those of side planes, of the phosphor layer is {001}. A plane orientation of some side planes out of the plurality of side planes is {110}.

Advantageous Effects of Invention

According to an aspect of the present invention, a wavelength conversion member that includes a single crystal phosphor and has a high yield rate can be provided.

DESCRIPTION OF EMBODIMENTS

[First Embodiment]

An embodiment of the present invention will be described below with reference to FIGS. 1 to 3. In the present embodiment, a reflective type light emitting device 10 will be described that includes a light emitting unit 1 (wavelength conversion member) including a phosphor layer 1a formed of a single crystal cerium-doped yttrium aluminum garnet (Ce:YAG) (phosphor). The term "reflective type" here indicates a structure in which a phosphor light is taken out from a plane on which an excitation light is radiated in the light emitting unit 1.

In the description below, with respect to a crystal structure, an individual orientation is represented by [ ], a collective orientation is represented by < >, an individual plane is represented by ( ), and a collective plane is represented by { }. Furthermore, when an index indicating a plane orientation of a crystal plane is negative, the index is normally marked with a superscript bar. However, in the claims, description, and abstract of the present invention, a minus is added before the index to indicate that the index is negative. Furthermore, a plane having a plane orientation of {abc} (a, b, and c each are an integer) is represented by an {abc} plane. In the case of a hexagonal single crystal, a plane having a plane orientation of {hklm} (h, k, l, and m each are an integer) is represented by an {hklm} plane.

(Light Emitting Device 10)

Figure 2:
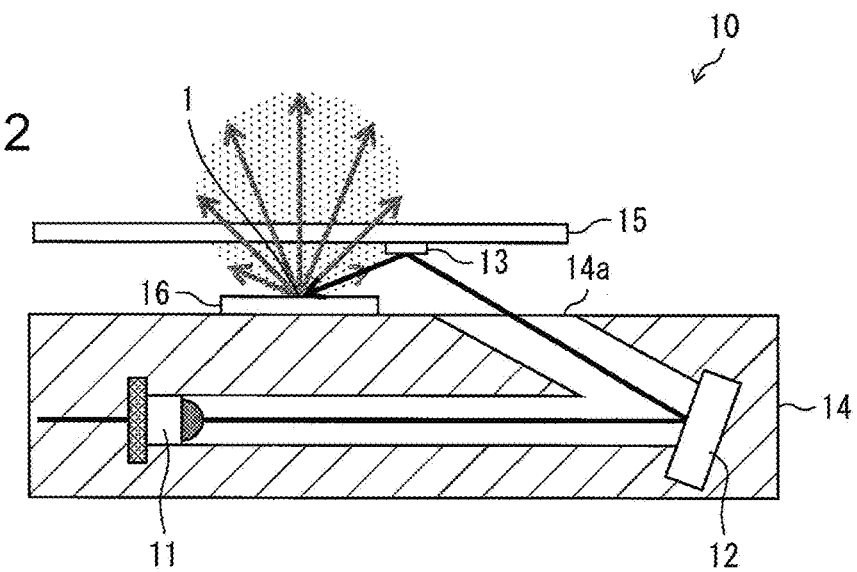
FIG. 2 is a cross-sectional diagram illustrating a structure of a light emitting device according to the first embodiment of the present invention.

FIG. 2 is a cross-sectional diagram illustrating a structure of a light emitting device 10 according to the present embodiment. As illustrated in FIG. 2, the light emitting device 10 includes a laser light source 11, a first mirror 12, a second mirror 13, the light emitting unit 1, a housing 14, a transparent member 15, and a retaining member 16.

The laser light source 11 (excitation light source) is a light source that emits a laser light (excitation light). In the present embodiment, the laser light source 11 has a structure in which a laser diode is mounted in a metal package with a lens having a diameter of 9 mm. Furthermore, the wavelength of the laser light emitted by the laser diode is 445 nm and the output thereof is 5 W.

It is to be noted that the size of the laser diode included in the laser light source 11, the wavelength and output of the laser light emitted by the laser diode, the mounting form of the laser light source 11, and the like are not limited to the above-described ones. The laser light source 11 has a structure in which a laser diode is mounted in a metal package with a lens having a diameter of 9 mm and thus has an advantage that the structure thereof is easily downsized. However, a metal package with a lens does not have to be used necessarily, and a lens and a metal package may be separate. Furthermore, instead of the laser light source 11, a laser other than a semiconductor laser, for example, a gas laser, a light emitting diode (LED), or the like may be used as an excitation light source.

The first mirror 12 and the second mirror 13 are reflective mirrors that guide the laser light emitted by the laser light source 11 to the light emitting unit 1. The first mirror 12 is provided in the housing 14 which will be described later. The second mirror 13 is provided on a plane of the transparent member 15 which will be described later. The plane faces the light emitting unit 1.

The housing 14 is a member that contains the laser light source 11 and the first mirror 12. On the housing 14, an opening 14a is provided. The laser light emitted by the laser light source 11 is reflected on the first mirror 12 and output to the outside of the housing 14 from the opening 14a.

In the present embodiment, the housing 14 is formed of a material that has a high thermal conductivity such as a metal (for example, aluminum, stainless, copper, or iron). This enables the housing 14 to absorb heat generated by the laser light source 11 and release the heat in an effective manner. It is to be noted that the housing 14 may contain a substance having a high thermal conductivity that is not a metal (for example, a high thermal conductivity resin or a high thermal conductivity ceramics).

Furthermore, the housing 14 may be in a state in which a member being transparent is fit in the opening 14a so as to seal up the inside of the housing 14. This enables to suppress moisture from entering into the housing 14 to generate dew condensation or the like. With this, an optical component provided in the housing 14 such as the laser light source 11 can be protected from moisture or the like. It is to be noted that welding may be used to seal up the inside of the housing 14 so that the air tightness inside the housing 14 is further improved.

Furthermore, to seal up the inside of the housing 14, not only the opening 14a but also the transparent member 15 may be sealed up. This enables to keep the light emitting unit 1 from contamination or the like. Furthermore, the method of sealing up the inside of the housing 14 is not limited to welding. Other methods, for example, brazing with a brazing material using Inconel or the like may be employed.

The transparent member 15 is a plate-like member formed of a material being transparent such as glass. The transparent member 15 operates as a window of the light emitting device 10 for taking out a phosphor light generated by the light emitting unit 1 to the outside of the light emitting device 10.

The retaining member 16 is a member that retains the light emitting unit 1. Specifically, the retaining member 16 is a circular plate fixed on an outer plane of the housing 14. The thickness of the retaining member 16 is 0.1 mm or higher. In the center of the retaining member 16, a hole part is provided. The light emitting unit 1 is fitted in the hole part and thus retained in the retaining member 16. The retaining member 16 is formed of a material having a high thermal conductivity, similarly to the housing 14. This enables the retaining member 16 to absorb heat generated by the light emitting unit 1 and release the heat in an effective manner. It is to be noted that the light emitting unit 1 may be attached to the housing 14 using a brazing material such as a solder, not through the retaining member 16.

(Light Emitting Unit 1)

Figure 1:
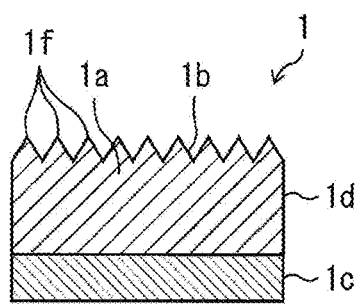
FIG. 1 is a cross-sectional diagram illustrating a structure of a light emitting unit according to a first embodiment of the present invention.

FIG. 1 is a cross-sectional diagram illustrating a structure of a light emitting unit 1. The light emitting unit 1 is a wavelength conversion member that converts a wavelength of a laser light output from the laser light source 11. As illustrated in FIG. 1, the light emitting unit 1 includes the phosphor layer 1a and a reflective layer 1c. The light emitting unit 1 is 1 mm square in size and has a flake shape with a thickness of about 20 µm.

The phosphor layer 1a generates a phosphor light excited by the laser light that has been output by the laser light source 11 and has a wavelength different from the laser light. The phosphor layer 1a includes divided planes 1d (side planes) and a principal plane 1b (upper plane) that has an area larger than those of the divided planes 1d. The laser light output by the laser light source 11 is incident on the phosphor layer 1a from the principal plane 1b. The phosphor light generated on the phosphor layer 1a is output from the principal plane 1b. Furthermore, the phosphor layer 1a is connected with the reflective layer 1c on a plane facing the principal plane 1b.

The phosphor layer 1a is formed of a single crystal phosphor. In the present embodiment, the phosphor layer 1a is formed of a single crystal cerium-doped yttrium aluminum garnet (Ce:YAG). Furthermore, in the present embodiment, the thickness of the phosphor layer 1a is 20 µm.

Figure 3:
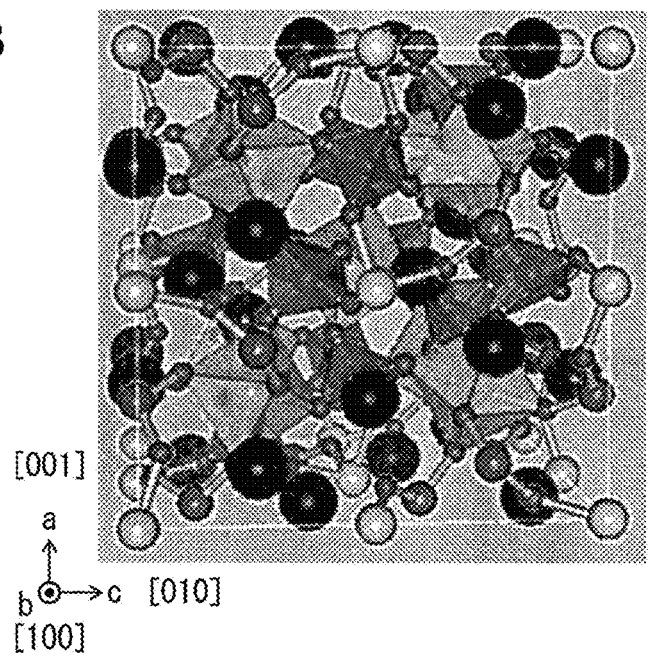
FIG. 3 is a diagram illustrating a crystal structure of a general garnet-based phosphor material.

FIG. 3 is a diagram illustrating a crystal structure of a general garnet-based phosphor material. In FIG. 3, the direction parallel with the paper plane which is marked with an arrow a is a direction [001] of the crystal. The direction parallel with the paper plane which is marked with an arrow c is a direction [010] of the crystal. An arrow b (arrow extending from the paper plane to the front) is a direction [100] of the crystal. (FIG. 3 is sourced from "http://www.geo.shimane-u.ac.jp/akasaka/SaikoGakufu.htm".)

The principal plane 1b is a plane on which a laser light reflected on the second mirror 13 is incident into the phosphor layer 1a. Furthermore, the principal plane 1b also is a plane from which a phosphor light from the inside of the phosphor layer 1a is output. In the present embodiment, the plane orientation of the principal plane 1b is {111}. On the principal plane 1b, a texture 1f formed by a plurality of square pyramid shapes is formed. The size of a square pyramid-shape is on the order of submicron. The texture 1f is formed on the principal plane 1b, so that lights output from the principal plane 1b are isotropically distributed regardless of the incident direction of the laser light incident into the phosphor layer 1a.

The shape of the texture is not limited to the square pyramid shape described above. For example, the shape of the texture may be a conical shape or a dome shape. Furthermore, the texture may be formed by a groove whose cross section is in a U shape, for example.

The reflective layer 1c is a reflective layer that reflects a laser light as an excitation light and a phosphor light generated at the phosphor layer 1a. The reflective layer 1c is formed of a material indicating a high reflectance in wavelength ranges of the excitation light and the light whose wavelength has been converted at the phosphor layer 1a.

The reflective layer 1c is a layer whose main component (that accounts for 80% or higher) is a metal of which the reflectance of a light in a desired wavelength range (wavelength range of a phosphor light as a product specification) is 75% or higher, for example, aluminum or silver. In this case, a dielectric film serving as a reflection increasing coating that increases the reflectance may be provided between the phosphor layer 1a and the reflective layer 1c. Furthermore, to improve the adhesiveness between the phosphor layer 1a and the reflective layer 1c, an adhesion layer formed of a metal, such as nickel, whose thickness is 100 nm or lower may be provided. Alternatively, the reflective layer 1c may be a dielectric multilayer film configured such that the above-described reflectance of a light in a desired wavelength range is 75% or higher.

Furthermore, when attaching the light emitting unit 1 to the retaining member 16 or the like using a brazing material such as a solder, there is a risk that a solder material is scattered inside the reflective layer 1c to lower the reflectance of the reflective layer 1c. For this reason, to prevent the solder material from being scattered into the reflective layer 1c, on a part of the reflective layer 1c that contacts the retaining member 16, a film formed of platinum or titanium being a barrier metal is preferably formed. Furthermore, on an outer side of the film of a barrier metal, a film of a metal such as gold is preferably formed so as to form a eutectic with the solder material.

The divided planes 1d are cut planes obtained when cutting out the phosphor layer 1a from a single crystal phosphor wafer at the time of manufacture of the light emitting unit 1 and correspond to a plurality of side planes included in the phosphor layer 1a. Out of the plurality of divided planes 1d, some divided planes 1d have a plane orientation of {1-10}. In the present embodiment, the number of the divided planes 1d is four. Two out of the divided planes 1d are {1-10} planes of the single crystal. Two remaining divided planes 1d are planes perpendicular to both the {1-10} planes and a {111} plane of the single crystal.

Furthermore, the plane orientation of the principal plane 1b may be {001}. In this case, some divided planes 1d out of the plurality of divided planes 1d have a plane orientation of {1-10}.

(Effect of Light Emitting Unit 1)

A garnet-based phosphor material is a material for which single crystal processing is difficult. Specifically, in a manufacture process of a phosphor layer formed of a garnet-based single crystal, irregular breakage and chipping are generated. This causes a problem in that the yield rate of the phosphor is lowered.

As causes of the problem described above, the following matters can be pointed out: (i) a single crystal of the garnet-based phosphor material has no cleavage; (ii) the phosphor material has to be processed into a flake shape; and (iii) a structure has to be formed on a surface of the phosphor, and in the process of forming the structure, a stress or damage is given to the phosphor.

The inventors of the present application have repeatedly manufactured phosphor layers formed of a garnet-based single crystal phosphor. Consequently, the inventors have found the following matters: (i) when the plane orientation of the principal plane is {111} and the plane orientation of some divided planes out of a plurality of divided planes is {1-10}; or (ii) when the plane orientation of the principal plane is {001} and the plane orientation of some divided planes out of a plurality of divided planes is {110}, the above-described single crystal becomes less prone to the irregular breakage and chipping described above.

In the light emitting unit 1 according to the present embodiment, the phosphor layer 1a is a single crystal of Ce:YAG being a garnet-based phosphor and configured to satisfy either one of the conditions (i) or (ii) described above. With this, at the time of manufacture of the light emitting unit 1, the phosphor layer 1a is less prone to irregular breakage and chipping. The light emitting unit 1 thus indicates a higher yield rate.

It is to be noted that the phosphor forming the phosphor layer 1a is not limited to the above-described Ce:YAG single crystal, and an optional garnet-based single crystal phosphor, for example, cerium-doped lutetium aluminum garnet (Ce:LuAG) or cerium-doped gadolinium aluminum gallium garnet (Ce:GAGG) may be used.

It is to be noted that as described above, in the present embodiment, the thickness of the phosphor layer 1a is 20 μm. However, the thickness of the phosphor layer 1a is not limited to this value and may be any value lower than or equal to 1 mm. In view of the yield rate of the light emitting unit 1 at the time of handling and division thereof, however, the thickness of the phosphor layer 1a is preferably within the range of 10 μm or higher to 170 μm or lower.

Furthermore, the thickness of the phosphor layer 1a is preferably higher than that of the reflective layer 1c. When the thickness of the phosphor layer 1a is lower than or equal to that of the reflective layer 1c, division of the light emitting unit 1 becomes difficult depending on the physical property of the reflective layer 1c. For example, when the thickness of the phosphor layer 1a is 100 μm and the reflective layer 1c is formed of silver whose thickness is 500 μm, division (cutting) of the reflective layer 1c into a desired shape has been disabled, whereby the yield rate of the light emitting unit 1 is lowered.

Figure 4:
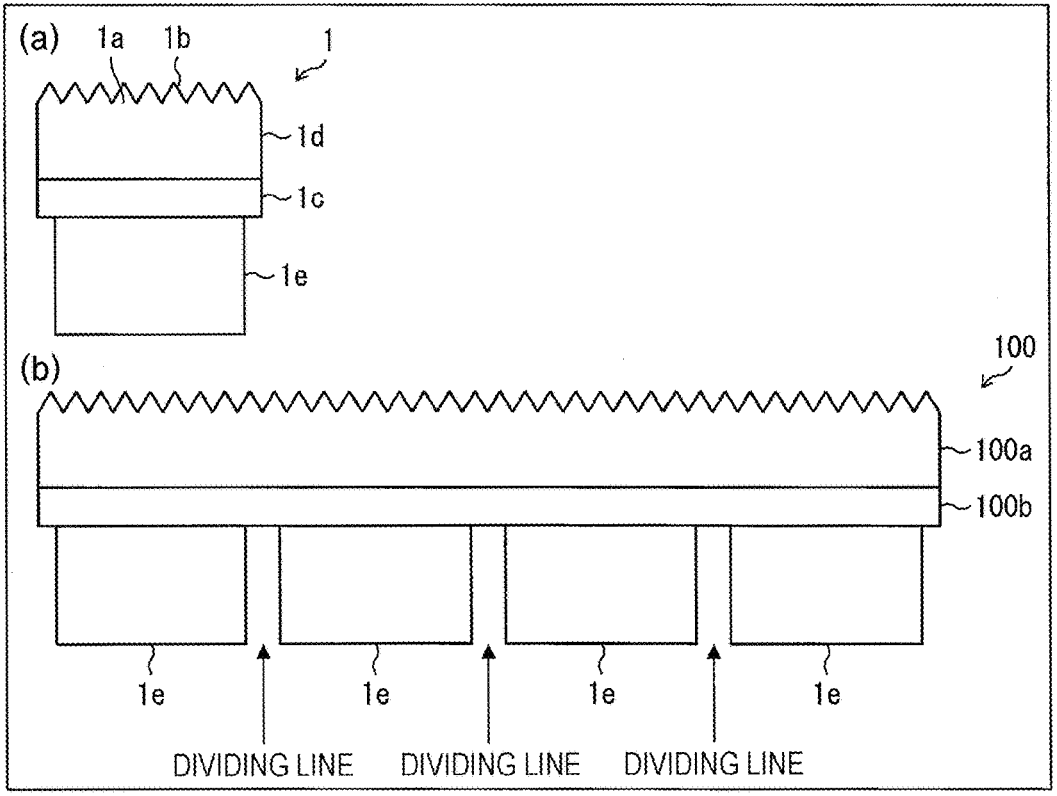
FIG. 4(a) is a cross-sectional diagram illustrating a structure of a light emitting unit including a supporting layer.
FIG. 4(b) is a cross-sectional diagram illustrating a structure of a light emitting unit wafer before the light emitting unit including the supporting layer is divided.

Furthermore, FIG. 4(a) is a cross-sectional diagram illustrating a structure of a light emitting unit 1 including a supporting layer 1e. As illustrated in FIG. 4(a), the light emitting unit 1 may include the supporting layer 1e. The supporting layer 1e is a member that suppresses generation of irregular breakage and chipping at the time of division of the light emitting unit 1. The supporting layer 1e is provided on a plane, which is reverse to the plane facing the phosphor layer 1a, of the reflective layer 1c. Furthermore, the supporting layer 1e is formed so as to be thicker than the phosphor layer 1a.

FIG. 4(b) is a cross-sectional diagram illustrating a structure of a light emitting unit wafer 100 before the light emitting unit 1 including the supporting layer 1e is divided. As illustrated in FIG. 4(b), the light emitting unit wafer 100 includes a phosphor layer wafer 100a, a reflective layer wafer 100b, and a plurality of supporting layers 1e. The supporting layers 1e are distributed in regions other than dividing lines by which the light emitting unit 1 is divided, as illustrated in FIG. 4(b). Dividing the light emitting unit wafer 100 described above along the dividing lines improves the yield rate at the time of forming the light emitting unit 1 illustrated in FIG. 4(a).

As a specific example, on the phosphor layer wafer 100a, an aluminum film whose thickness is 100 nm has been formed as the reflective layer wafer 100b. Thereafter, the reflective layer wafer 100b has been pattern plated with nickel so that the plating is 50 μm thick as the supporting layer 1e using a photolithography technique. Thereafter, the phosphor layer wafer 100a further has been thinned to be 20 μm thick and then divided. This has produced no defective goods due to the division.

[Second Embodiment]

Another embodiment of the present invention will be described below with reference to FIGS. 5 to 8. In the present embodiment, a transmissive type light emitting device 20 that has a light emitting unit 2 including a single crystal of Ce:YAG will be described. "Transmissive type" here indicates a structure in which a phosphor light is taken out from a plane reverse to the plane on which an excitation light is radiated in the light emitting unit 1. It is to be noted that for the sake of explanation, a component having the same function as one described in the above-described embodiment will be denoted with the same reference character and the explanation thereof will be omitted.

(Light Emitting Device 20)

Figure 5:
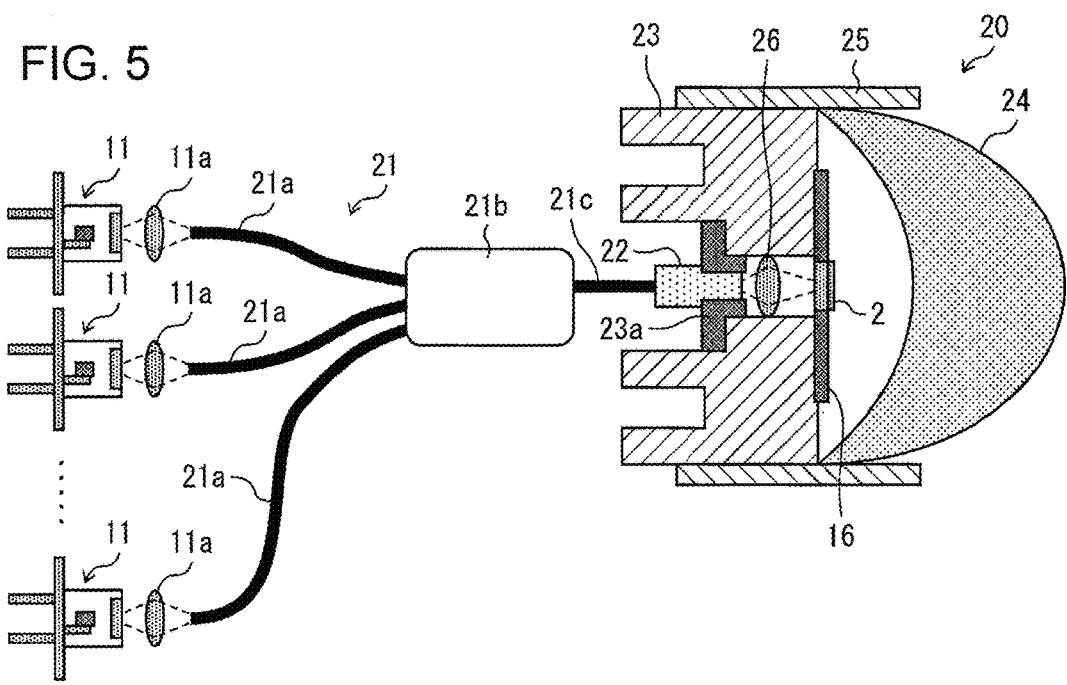
FIG. 5 is a cross-sectional diagram illustrating a structure of a light emitting device according to a second embodiment of the present invention.

FIG. 5 is a cross-sectional diagram illustrating a structure of the light emitting device 20 according to the present embodiment. As illustrated in FIG. 5, the light emitting device 20 includes a plurality of laser light sources 11 and lenses 11a, a retaining member 16, an optical fiber 21, a ferrule 22, a fixture 23, a lens 24, a lens fixing unit 25, and a light emitting unit 2.

The light emitting unit 2 is a wavelength conversion member that converts the wavelength of laser lights output from the laser light sources 11. The light emitting unit 2 will be described later in detail. The lenses 11a are lenses each of which collects laser lights emitted from respective one of the plurality of laser light sources 11.

The optical fiber 21 is a light guide member that guides the laser lights output from the laser light sources 11 and collected by the lenses 11a to the light emitting unit 2. The optical fiber 21 includes a plurality of incident side optical fibers 21a each corresponding to respective ones of the plurality of laser light sources 11, a combiner 21b that combines the optical fibers, and an output side optical fiber 21c being a multi-mode single core fiber. The optical fiber 21 has a structure in which the plurality of incident side optical fibers 21a are combined with the output side optical fiber 21c through the combiner 21b. The ferrule 22 is a member that retains the output side optical fiber 21c at the end part facing the light emitting unit 2.

The fixture 23 is a member to which the light emitting unit 2 is fixed. The fixture 23 has a cylindrical shape and has a hollow through which a light can pass. The light emitting unit 2 is fixed to the fixture 23 via the retaining member 16. Furthermore, the fixture 23 has a ferrule fixing unit 23a to which the ferrule 22 in which the output side optical fiber 21c is contained is fixed. A laser light output from an end plane of the output side optical fiber 21c contained in the ferrule 22 is incident in the light emitting unit 2 via an imaging lens 26.

The imaging lens 26 is installed such that the end plane of the output side optical fiber 21c and the light emitting unit 2 are in a substantially conjugate relation with each other. With this, the optical intensity distribution on the end plane, from which the laser light is output, of the output side optical fiber 21c is roughly reflected at the light emitting unit 2. The length of the optical fiber 21 is set such that the intensity distribution of the laser lights is a substantially top hat distribution at the end plane of the output side optical fiber 21c. This enables to uniform the optical intensity distribution at the light emitting unit 2 and thus enables the light emitting unit 2 to be a light source that emits a light with high brightness and high luminous flux.

Furthermore, the ratio between the area of the light emitting unit 2 and that of the laser lights substantially projected at the light emitting unit 2 is preferably 1:0.7 or higher, and more preferably 1:09 or higher. When the ratio between the area of the light emitting unit 2 and that of the laser lights substantially projected at the light emitting unit 2 is within the above-described ranges, optical loss due to in-plane propagation of the laser lights within the light emitting unit 2 can be reduced.

Furthermore, the fixture 23 is formed of a material having a high thermal conductivity. The fixture 23 further has serrated heat radiating fins formed around the ferrule fixing unit 23a. This enables heats generated at the light emitting unit 2 to be easily radiated to the outside via the retaining member 16 and the fixture 23.

The lens 24 is a meniscus lens that projects a light whose wavelength has been converted at the light emitting unit 2 to the outside. The lens 24 thus is a lens that can effectively project a light from a light source with lambertian light distribution such as an LED or a laser light source. Furthermore, the lens 24 is an aspherical lens. An aberration of the lens 24 thus is small compared with that of a spherical lens. The lens fixing unit 25 fixes the lens 24 to the light emitting unit 2. In the present embodiment, the lens fixing unit 25 has a cylindrical shape that surrounds the side plane of the fixture 23 and the side of the lens 24. However, the shape of the lens fixing unit 25 is not limited to the cylindrical shape.

(Light Emitting Unit 2)

Figure 6:
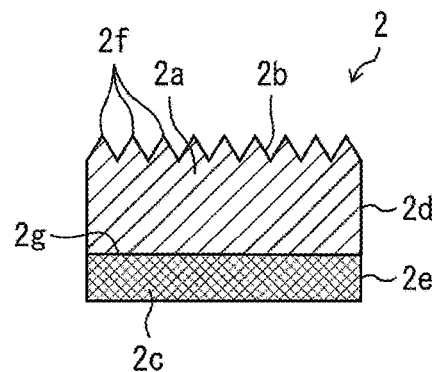
FIG. 6 is a cross-sectional diagram illustrating a structure of a light emitting unit according to the second embodiment of the present invention.
Figure 7:
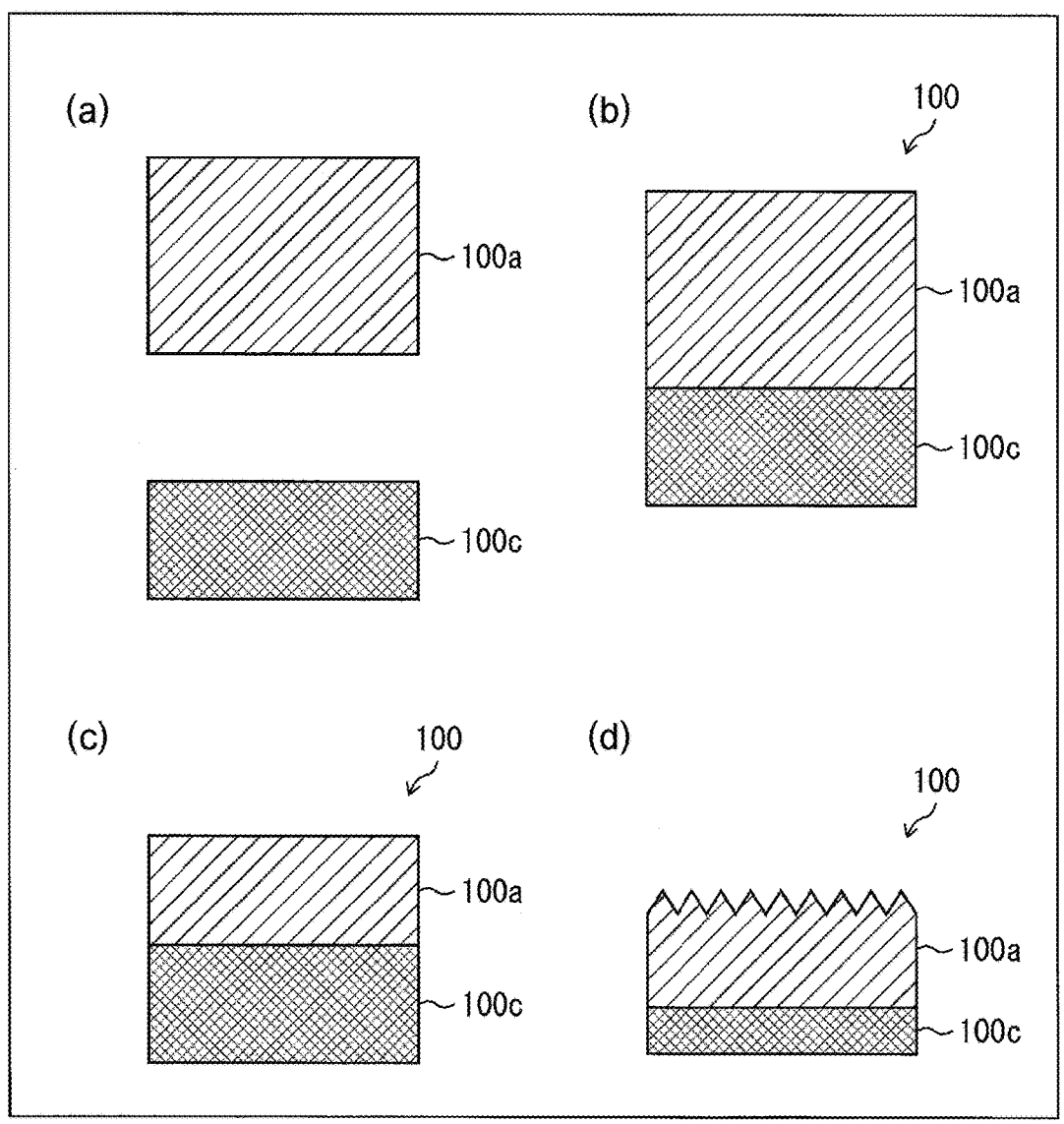
FIGS. 7(a) to 7(d) each are a diagram for explaining a manufacture process of the light emitting unit.
Figure 8:
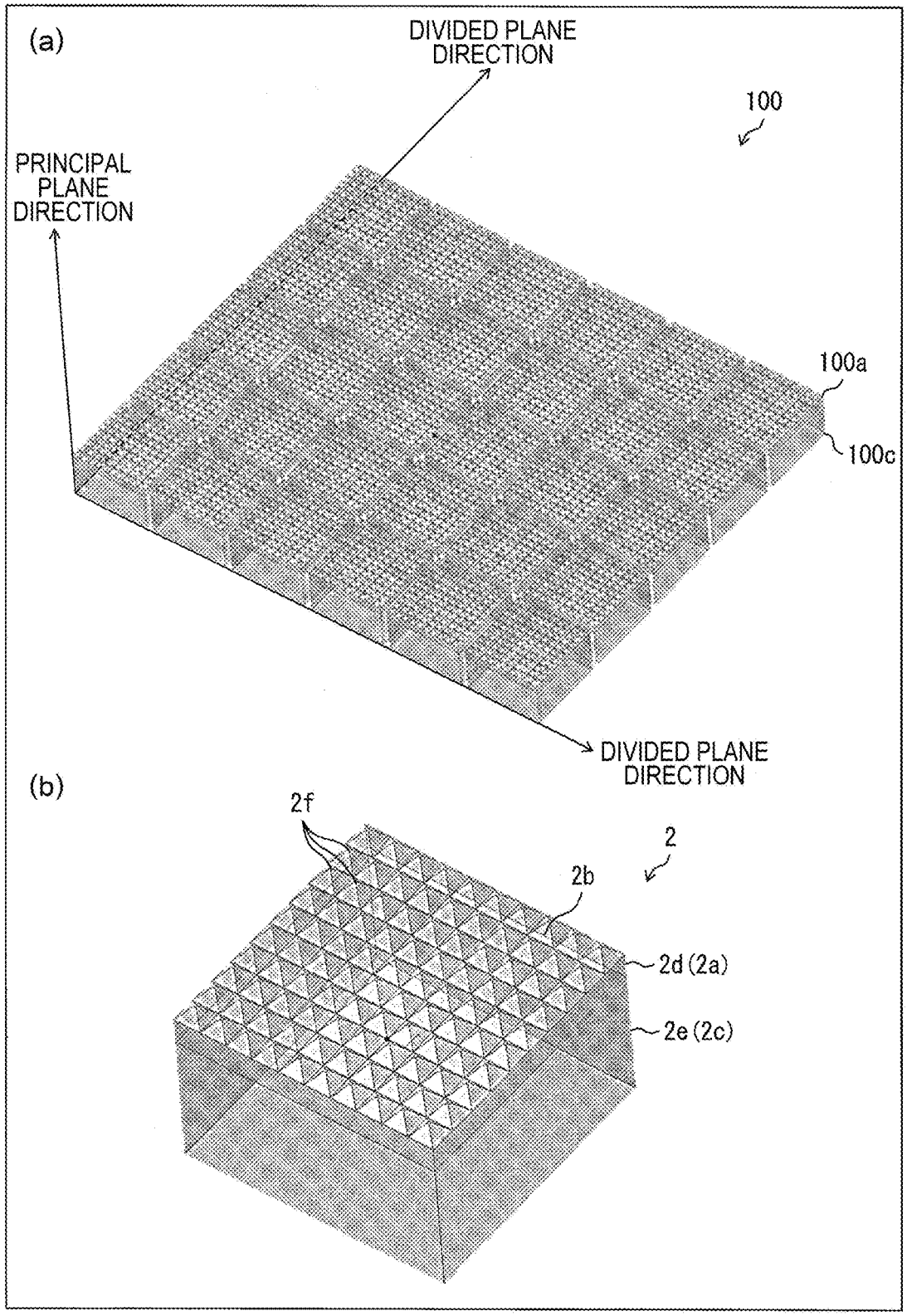
FIG. 8(a) is a perspective diagram illustrating a shape of a light emitting unit wafer.
FIG. 8(b) is a perspective diagram illustrating a shape of the light emitting unit.

FIG. 6 is a cross-sectional diagram illustrating a structure of the light emitting unit 2. As illustrated in FIG. 6, the light emitting unit 2 includes a phosphor layer 2a and a transparent layer 2c. The light emitting unit 2 is 1 mmϕ and has a flake shape with a thickness of 0.12 mm.

The phosphor layer 2a is a member that generates a phosphor light excited by the laser light that has been output by the laser light source 11 and has a wavelength different from the laser light. The phosphor layer 2a includes divided planes 2d (side plane) and a principal plane 2b (upper plane) that has an area larger than those of the divided planes 2d. In the present embodiment, the principal plane 2b is a {111} plane of a Ce:YAG single crystal, similarly to the principal plane 1b. Furthermore, the number of the divided planes 2d is four, similarly to the divided planes 1d. Furthermore, some divided planes 2d are {1-10} planes of the Ce:YAG single crystal, similarly to the divided lanes 1d. Furthermore, the thickness of the phosphor layer 2a is 20 μm, similarly to the phosphor layer 1a.

The transparent layer 2c is a member being transparent. The transparent layer 2c is provided to compensate the mechanical strength of the phosphor layer 2a and improve the thermal conductivity thereof. The transparent layer 2c is formed of a transparent signal crystal. In the present embodiment, the transparent layer 2c is a sapphire single crystal with a thickness of 100 μm. In view of workability in the manufacture method of the light emitting unit 2, which will be described later, the transparent layer 2c is preferably a single crystal. Furthermore, in view of the thermal conductivity, the transparent layer 2c is preferably a sapphire single crystal.

The transparent layer 2c includes divided planes 2e and a principal plane 2g that has an area larger than those of the divided planes 2e. The transparent layer 2c is connected with a plane (bottom plane) facing the principal plane 2b of the phosphor layer 2a on the principal plane 2g. The principal plane 2g is a sapphire (0001) plane.

The transparent layer 2c includes the divided planes 2e whose number is the same as that of the divided planes 2d of the phosphor layer 2a. That is to say, in the present embodiment, the number of the divided planes 2e is four. Some of the plurality of divided planes 2e are {1-100} planes of the sapphire forming the transparent layer 2c.

Each of the divided planes 2e is present on the same plane of respective divided planes 2d. Especially, the {1-100} planes of the divided planes 2e are present on the same planes of the {1-10} planes of the divided planes 2d. However, each of the divided planes 2e does not have to be present on the same plane of the respective divided planes 2d necessarily, and may be substantially parallel with the respective divided planes 2d. That is to say, a plane, which has a plane orientation of {1-100}, of the transparent layer 2c may be parallel with one of the divided planes 2d, which has a plane orientation of {1-10}, of the phosphor layer 2a.

Furthermore, the plane orientation of the principal plane 2b of the phosphor layer 2a may be {001}, similarly to the principal plane 1b. With this, the plane orientation of some divided planes out of the plurality of divided an 2d is {110}, similarly to the divided planes 1d. In this case, a plane, which has a plane orientation of {1-100}, of the transparent layer 2c may be parallel with a divided plane, which has a plane orientation of {110}, of the phosphor layer 2a.

In the present embodiment, a laser light passes through the transparent layer 2c to be incident in the phosphor layer 2a from a joint plane between the transparent layer 2c and the phosphor layer 2a. Furthermore, a phosphor light generated at the phosphor layer 2a is output from the principal plane 2b. Furthermore, a dichroic mirror that transmits an excitation light (laser light) and reflects a phosphor light is preferably provided between the phosphor layer 2a and the transparent layer 2c.

(Manufacture Method of Light Emitting Unit 2)

FIGS. 7(a) to 7(d) each are a diagram for explaining a manufacture process of the light emitting unit 2. At the time of manufacture of the light emitting unit 2, firstly, as illustrated in FIG. 7(a), the phosphor layer wafer 100a formed of a single crystal phosphor and a transparent layer wafer 100c formed of a transparent single crystal are separately manufactured. At this time, thickness of the transparent layer wafer 100c is 600 μm.

Next, as illustrated in FIG. 7(b), the phosphor layer wafer 100a and the transparent layer wafer 100c are connected to form the light emitting unit wafer 100. In the present embodiment, firing is performed with an alumina binder provided between the phosphor layer wafer 100a and the transparent layer wafer 100c, whereby the light emitting unit wafer 100 is formed. In view of the refractive index, an alumina-based binder is preferably used for bonding the phosphor layer wafer 100a and the transparent layer wafer 100c. However, other type of inorganic binder, for example, a silica-based binder may be used. It is to be noted that the inventors of the present application have manufactured a light emitting unit wafer using an organic binder to conduct a long-term reliability test, and the binder has been deteriorated to lower the transmittance of an excitation light. From this background, an inorganic binder is preferably used for manufacturing a light emitting unit wafer in view of long-term reliability.

Furthermore, in the present embodiment, the {111} plane of the phosphor layer wafer 100a and the {0001} plane of the sapphire forming the transparent layer wafer 100c are connected with each other. At this time, the connection is made such that the {1-10} plane of the phosphor layer wafer 100a and the {1-100} plane of the sapphire forming the transparent layer wafer 100c are parallel with each other.

Thereafter, as illustrated in FIG. 7(c), a surface of the phosphor layer wafer 100a is polished. Furthermore, as illustrated in FIG. 7(d), on the surface of the phosphor layer wafer 100a that has been polished, a texture 2f (see FIG. 6) is formed. The methods of forming the texture 2f may include photolithography and etching using inductively coupled plasma (ICP). Furthermore, to easily break the light emitting unit wafer 100 into pieces, the thickness of 600 μm of the transparent layer wafer 100c is ground or polished to be 100 μm.

It is to be noted that in view of the thermal conductivity, the thickness of the transparent layer wafer 100c is preferably as thick as possible. For this reason, in the case of application with which the yield rate is ignored and the thermal conductivity is emphasized, the transparent layer wafer 100c is preferably used without changing the thickness of 600 μm.

FIG. 8(a) is a perspective diagram illustrating a shape of the light emitting unit wafer 100. FIG. 8(b) is a perspective diagram illustrating a shape of the light emitting unit 2. The light emitting unit wafer 100 illustrated in FIG. 8(a) is broken into 1 mm square pieces by stealth dicing using a laser scriber. Consequently, the light emitting unit 2 illustrated in FIG. 8(b) is formed.

At this time, the light emitting unit wafer 100 is cut along directions parallel with and perpendicular to the {1-10} plane of the phosphor layer wafer 100a and the {1-100} plane of the transparent layer wafer 100c. Consequently, on a divided plane 2d and a divided plane 2e, the {1-10} plane of the phosphor layer 2a and the {1-100} plane of the sapphire of the transparent layer 2c are present on the same plane.

(Effect of Light Emitting Unit 2)

The light emitting unit 2 is a light emitting unit applicable to a transmissive type light emitting device such as a light emitting device 20. Generally, a light emitting unit used for a transmissive type light emitting device is very thin and thus easily broken in an intended direction. For this reason, in the light emitting unit 2, a sapphire substrate is connected with the phosphor layer 2a to serve as the transparent layer 2c, whereby the overall strength of the light emitting unit 2 is improved. However, sapphire also is a material prone to irregular breakage and chipping at the time of processing.

The inventors of the present application repeatedly manufactured phosphors applicable to a transmissive type light emitting device. Consequently, the inventors have found that a sapphire substrate is easily split to be divided along the {1-100} plane.

From this background, the light emitting unit 2 according to the present embodiment is configured such that a divided plane 2e of the transparent layer 2c is the {1-100} plane of the sapphire. That is to say, the transparent layer 2c is cut along the direction parallel with the {1-100} plane of the sapphire. With this, the irregular breakage and chipping described above are hardly generated, whereby the yield rate of the light emitting unit 2 is improved.

Furthermore, the inventors of the present application repeatedly manufactured a light emitting unit 2 with the angle of a divided plane 2e changed. Consequently, as long as the tilt of the divided plane 2e is within ±10° from the {1-100} plane of the sapphire, no significant difference has been found with the yield rate of the light emitting unit 2, compared with the case where the divided plane 2e is the {1-100} plane of the sapphire.

[Third Embodiment]

Another embodiment of the present invention will be described below with reference to FIG. 9. In the present embodiment, a phosphor including a diffusion layer will be described.

Figure 9:
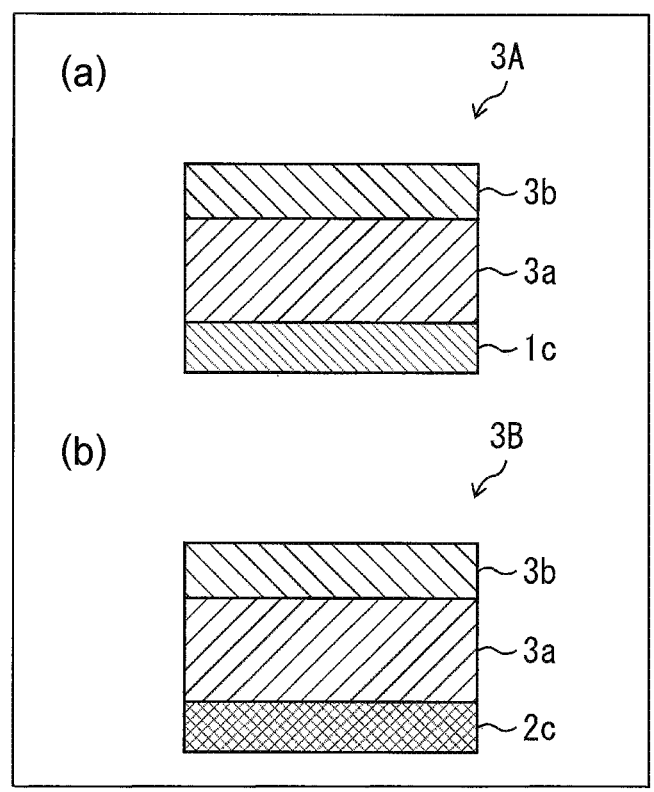
FIGS. 9(a) and 9(b) each are a cross-sectional diagram illustrating a structure of a light emitting unit according to a third embodiment of the present invention.

FIG. 9 illustrates cross-sectional diagrams each illustrating a structure of a light emitting unit according to the present embodiment. FIG. 9(a) is a cross-sectional diagram illustrating a structure of a light emitting unit 3A applied to a reflective type light emitting device. As illustrated in FIG. 9(a), the light emitting unit 3A includes a phosphor layer 3a, a reflective layer 1c, and a diffusion layer 3b. Furthermore, FIG. 9(b) is a cross-sectional diagram illustrating a structure of a light emitting unit 3B applied to a transmissive type light emitting device. As illustrated in FIG. 9(b), the light emitting unit 3B includes a phosphor layer 3a, a transparent layer 2c, and a diffusion layer 3b.

The phosphor layer 3a is the same member as the phosphor layers 1a and 2a except that no texture is formed on the phosphor layer 3a. The diffusion layer 3b is a member that isotropically diffuses lights output from the phosphor layer 3a. Examples of the diffusion layer 3b include spherical sapphire and an inorganic membrane having a large number of voids.

The light emitting unit 3A and light emitting unit 3B described above also can isotropically output lights whose wavelength has been converted by the respective light emitting units, similarly to the light emitting units 1 and 2.

[Fourth Embodiment]

Figure 10:
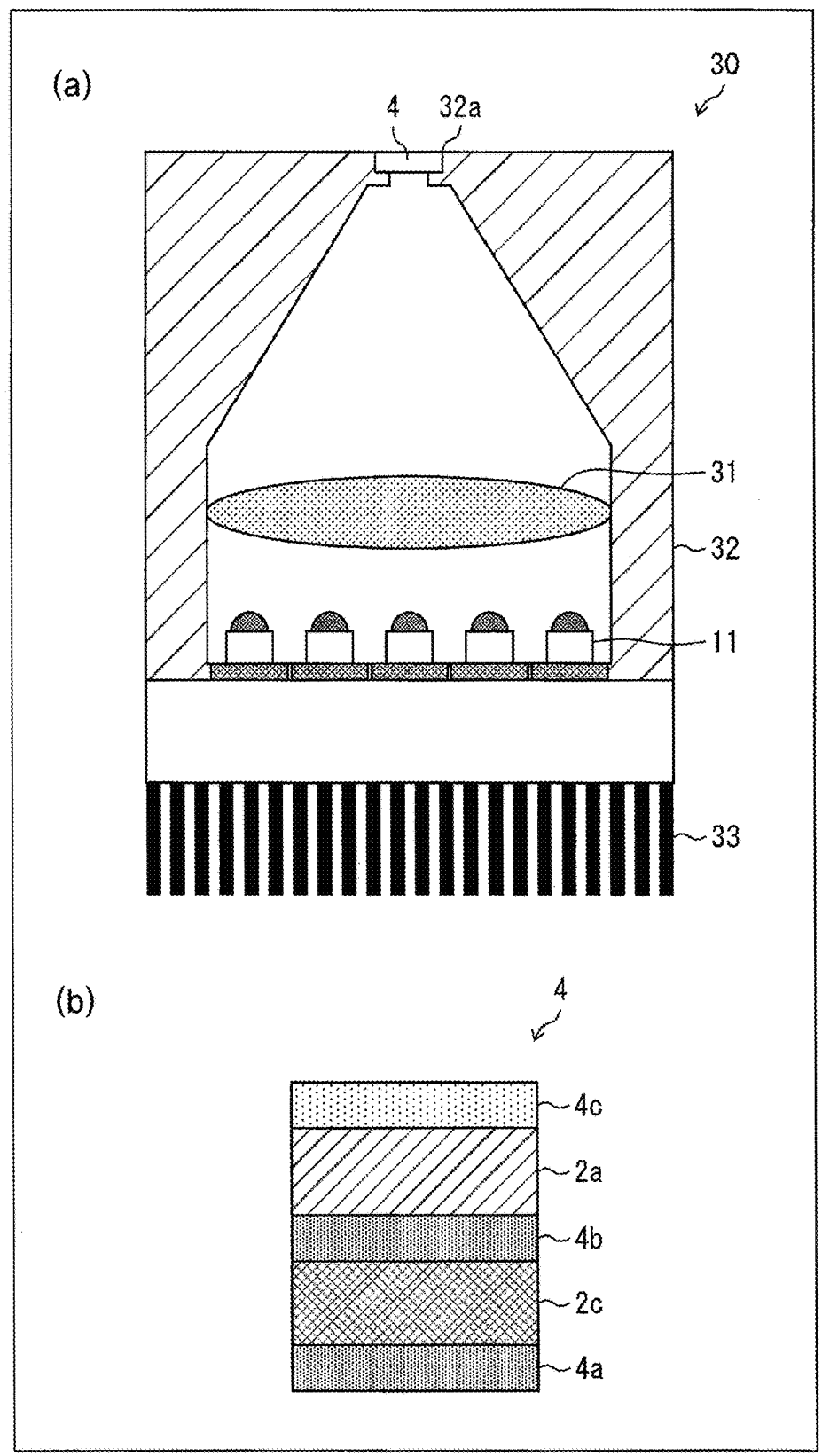
FIG. 10(a) is a cross-sectional diagram illustrating a structure of a light emitting device according to a fourth embodiment of the present invention.
FIG. 10(b) is a cross-sectional diagram illustrating a structure of a phosphor included in the light emitting device illustrated in FIG. 10(a).

Another embodiment of the present invention will be described below with reference to FIG. 10. In the present embodiment, a light emitting device 30 applicable to a light source for a projector will be described.

(Light Emitting Device 30)

FIG. 10(a) is a cross-sectional diagram illustrating a structure of the light emitting device 30 according to the present embodiment. As illustrated in FIG. 10(a), the light emitting device 30 includes a plurality of laser light sources 11, a concentrating lens 31, a housing 32, a heat radiating member 33, and a light emitting unit 4.

The concentrating lens 31 is a lens that collects laser lights emitted by the plurality of laser light sources 11 towards the light emitting unit 4. In the present embodiment, the concentrating lens 31 is a convex-shaped spherical lens.

The housing 32 is a housing that contains the laser light sources 11 and the concentrating lens 31. Furthermore, a hole part 32a is provided on the housing 32. On the hole part 32a, the light emitting unit 4 is provided. The light emitting unit 4 thus converts the wavelength of the laser lights from the laser light sources 11 and operates as a window for taking the lights out from the light emitting device 30.

The heat radiating member 33 is a heat sink formed of a metal material having a high thermal conductivity. The heat radiating member 33 absorbs heats from the laser light sources 11 and radiates the absorbed heats to the outside air. The heat radiating member 33 includes serrated heat radiating fins as illustrated in FIG. 10(a) to improve the heat radiation efficiency. In the present embodiment, the material of the heat radiating member 33 is aluminum.

(Light Emitting Unit 4)

FIG. 10(b) is a cross-sectional diagram illustrating a structure of the light emitting unit 4 included in the light emitting device 30. As illustrated in FIG. 10(b), the light emitting unit 4 includes a phosphor layer 2a and a transparent layer 2c.

On each of a plane, which faces the laser light sources 11, of the transparent layer 2c and a joint plane between the transparent layer 2c and the phosphor layer 2a, an excitation light anti-reflection (AR) coats 4a and 4b are applied, respectively. The excitation light AR coats 4a and 4b each are a coat layer exhibiting a low reflectance in wavelength ranges of the laser lights output from the laser light sources 11. With this, the laser lights output from the laser light sources 11 are hardly reflected on the above-described planes before being incident in the phosphor layer 2a.

Meanwhile, on a plane, which faces the outside of the light emitting device 30, of the phosphor layer 2a, an excitation light high-reflection (HR) coat 4c (coating) is applied. The excitation light HR coat 4c is a coat layer exhibiting a high reflectance in wavelength ranges of the laser lights output from the laser light sources 11. By contrast, in wavelength ranges other than those of the laser lights described above, the excitation light HR coat 4c exhibits a low reflectance. With this, the laser light whose wavelength has not been converted at the phosphor layer 2a are reflected on the excitation light HR coat 4c and hardly output from the light emitting unit 4. By contrast, phosphor lights whose wavelength has been converted at the phosphor layer 2a are not reflected on the excitation light HR coat 4c but output from the light emitting unit 4.

In the present embodiment, the laser lights output from the laser light sources 11 are blue lights whose wavelength is 445 nm. By contrast, the light whose wavelength has been converted by a Ce: YAG is yellow lights whose wavelength is 550 nm.

From this background, the excitation light HR coat 4c according to the present embodiment is configured to have a high reflectance to a light whose wavelength is at least near 445 nm and have a low reflectance to a light whose wavelength is at least near 550 nm. With this, the blue laser lights output from the laser light sources 11 are not output from the light emitting unit 4 and only yellow phosphor lights whose wavelength has been converted by the Ce:YAG are output from the light emitting unit 4.

The HR coat 4c described above may be formed by using a dielectric multilayer film, for example. As the dielectric multilayer film, a $SiO_2/TiO_2$ dielectric multilayer film may be used, for example.

As described above, according to the light emitting device 30 including the light emitting unit 4, only the lights whose wavelength has been converted by the light emitting unit 4 can be taken out. That is to say, the light emitting device 30 is a light emitting device that can be designed so as to take out a light in a specified color, for example, a yellow light.

[Fifth Embodiment]

Another embodiment of the present invention will be described below with reference to FIGS. 11 and 12. In the present embodiment, light-emitting devices 40 and 50 including a light emitting unit 2 will be described.

(Light Emitting Device 40)

Figure 11:
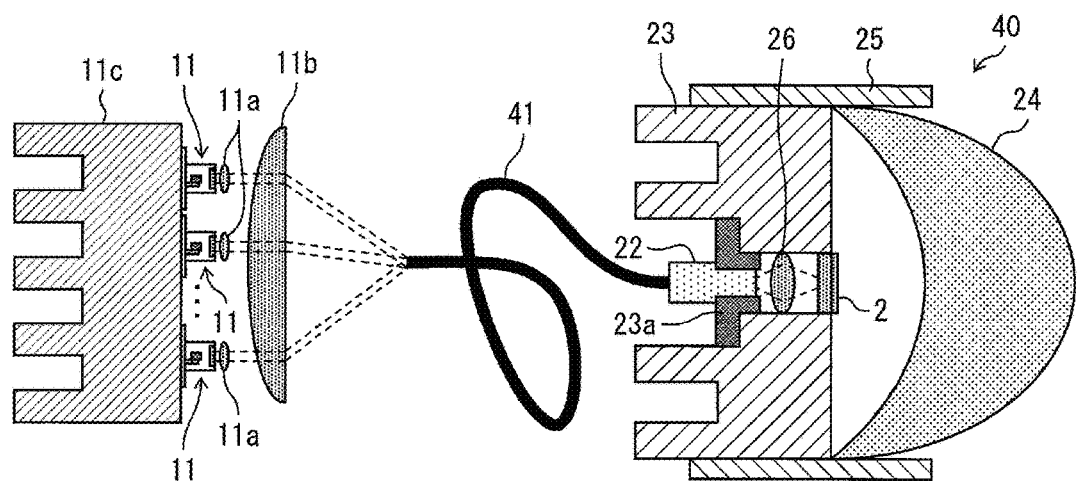
FIG. 11 is a cross-sectional diagram illustrating a structure of a light emitting device according to a fifth embodiment of the present invention.

FIG. 11 is a cross-sectional diagram illustrating a structure of the light emitting device 40. As illustrated in FIG. 11, the light emitting device 40 includes a plurality of laser light sources 11, a plurality of lenses 11a, a lens 11b, a heat radiating member 11c, an optical fiber 41, a ferrule 22, a fixture 23, a lens 24, a lens fixing unit 25, an imaging lens 26, and a light emitting unit 2.

The optical fiber 41 is a light guide member that guides the laser lights output from the laser light sources 11 and collected by the lenses 11a to the light emitting unit 2. The optical fiber 41 is a single core optical fiber. It should be noted that instead of the optical fiber 41, an optical waveguide device with which the intensity distribution of output lights at a light output end is a substantially top hat distribution, for example, a kaleidoscope or a rod lens may be used.

The lens 11b is a plano-convex lens that couples the laser lights output from the plurality of laser light sources 11 and collected by the lens 11a at one end of the optical fiber 41. The heat radiating member 11c is a member that radiates heats generated at the laser light sources 11.

The light emitting device 40 is configured to couple the laser lights from the plurality of laser light sources 11 at one end of the optical fiber 41 using the lens 11b. The light emitting device 40 having the configuration described above is better in view of cost and reliability, compared with the light emitting device 20.

(Light Emitting Device 50)

Figure 12:
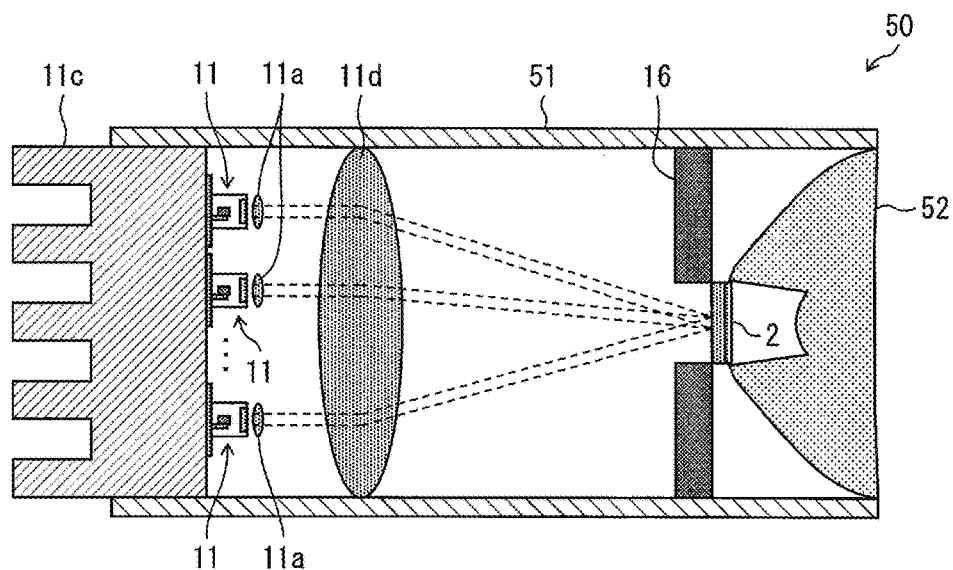
FIG. 12 is a cross-sectional diagram illustrating a structure of a light emitting device according to the fifth embodiment of the present invention.

FIG. 12 is a cross-sectional diagram illustrating a structure of the light emitting device 50. As illustrated in FIG. 12, the light emitting device 50 includes a plurality of laser light sources 11 and lenses 11a, a lens 11d, a heat radiating member 11c, a housing 51, a retaining member 16, a lens 52, and a light emitting unit 2.

The lens 11d is a convex lens that collects the laser lights collected by the lens 11a at the light emitting unit 2. The housing 51 is a housing that contains the heat radiating member 11c, the lens 11d, the retaining member 16, and the lens 52 in a retained manner. In the present embodiment, the housing 51 is a tubular member.

The lens 52 projects a light whose wavelength has been converted at the light emitting unit 2 to the outside. The lens 52 is a chip on board (COB) lens. The COB lens is a lens that can effectively project a light from a light source with lambertian light distribution such as an LED or a laser light source.

The light emitting device 50 is configured such that the laser lights from the laser light sources 11 directly excite the phosphor layer 2a with no optical fiber used. With the light emitting device 50 as described above, a spot of an excitation light radiated on the light emitting unit 2 is larger than those with the light emitting devices 20 and 40. However, the light emitting unit 50 enables lower cost, compared with the light emitting devices 20 and 40.

Each of the light emitting devices 40 and 50 described above can be suitably used as a light emitting device including the light emitting unit 2, similarly to the light emitting device 20. Furthermore, the light emitting devices 40 and 50 may include the light emitting unit 3B or the light emitting unit 4 instead of the light emitting unit 2.

CONCLUSION

A wavelength conversion member (light emitting unit 1) according to a first aspect of the present invention is a wavelength conversion member that converts a wavelength of an excitation light output from an excitation light source and includes a phosphor layer (1a) formed of a single crystal phosphor. A plane orientation of an upper plane (principal plane 1b), which has an area larger than those of side planes (divided planes 1d), of the phosphor layer is {111}. A plane orientation of some side planes out of the plurality of side planes is {1-10}.

With the configuration described above, the wavelength conversion member that converts a wavelength of an excitation light includes a phosphor layer formed of a single crystal phosphor of which the plane orientation of the upper plane is {111} and the plane orientation of some side planes out of a plurality of side planes is {1-10}.

The inventors of the present application have found that with respect to a phosphor layer formed of a garnet-based single crystal phosphor, when the plane orientation of the upper plane is {111} and the plane orientation of some side planes out of the plurality of side planes is {1-10}, the phosphor layer is less prone to irregular breakage and chipping at the time of manufacture of the phosphor layer. From this background, a wavelength conversion member that includes a single crystal phosphor and has a high yield rate can be provided by arranging the plane orientation of the upper plane and the side planes as described above.

A wavelength conversion member according to a second aspect of the present invention is a wavelength conversion member that converts a wavelength of an excitation light output from an excitation light source and includes a phosphor layer formed of a single crystal phosphor. A plane orientation of an upper plane, which has an area larger than those of side planes, of the phosphor layer is {001}. A plane orientation of some side planes out of the plurality of side planes is {110}.

According to the above-described configuration, similarly to the first aspect, a wavelength conversion member that includes a single crystal phosphor and has a high yield rate can be provided.

The wavelength conversion member according to a third aspect of the present invention further includes a transparent layer (2c) connected with a bottom plane that faces the upper plane, in the first aspect. The transparent layer is formed of a transparent single crystal. A plane (divided plane 2e), which has a plane orientation of {1-100}, of the transparent layer is preferably parallel with a side plane (divided plane 2d), which has a plane orientation of {1-10}, of the phosphor layer.

With the configuration described above, the wavelength conversion member further includes a transparent layer. The transparent layer is formed of a transparent single crystal. A plane, which has a plane orientation of {1-100}, of the transparent layer is parallel with a side plane, which has a plane orientation of {1-10}, of the phosphor layer.

The inventors of the present application have found that a transparent single crystal including a transparent layer has a characteristic that the {1-100} plane thereof is prone to breakage. From this background, the {1-100} plane of the transparent layer is arranged to be parallel with the {1-10} plane of the phosphor layer and dividing directions at the time of manufacture of the phosphor are uniformed. This enables the transparent layer to be less prone to irregular breakage and chipping, whereby the yield rate of the wave conversion member is improved.

The wavelength conversion member according to a fourth aspect of the present invention further includes a transparent layer connected with a bottom plane that faces the upper plane, in the second aspect. The transparent layer is formed of a transparent single crystal. A plane, which has a plane orientation of {1-100}, of the transparent layer is preferably parallel with a side plane, which has a plane orientation of {110}, of the phosphor layer.

With the configuration described above, similarly to the third aspect, the yield rate of the wavelength conversion member is improved.

In the wavelength conversion member according to a fifth aspect of the present invention, a coating (excitation light HR coat 4c) that reflects the excitation light is preferably applied on the upper plane, in any one of the first aspect to the fourth aspect.

With the configuration described above, when excitation lights are incident from the plane facing the principal plane of the wavelength conversion member, an excitation light whose wavelength has not been converted is reflected on the coating and is not output from the principal plane. Thus, only the lights whose wavelength has been converted by the wavelength conversion member can be taken out.

A light emitting device (10) according to a sixth aspect of the present invention includes any one of the wavelength conversion members according to the first aspect to the fifth aspect.

The present invention is not limited to the embodiments described above, and various modifications may be applied within the ranges indicated in the claims. An embodiment obtained by combining as appropriate technical means disclosed in different embodiments may be included in the technical scope of the present invention. Furthermore, by combining the technical means each disclosed in a different embodiment, a new technical feature may be built.

REFERENCE SIGNS LIST

1, 2, 3A, 3B, 4 light emitting unit (wavelength conversion member)
   1a, 2a, 3a phosphor layer
   1b, 2b principal plane (upper plane)
   1d, 2d, 2e divided plane (side plane)
   4c excitation light HR coat (coating)
   10, 20, 30 light emitting device
   11 laser light source (excitation light source)

The invention claimed is:

1. A wavelength conversion member that converts a wavelength of an excitation light output from an excitation light source, the wavelength conversion member comprising:
   a phosphor layer formed of a single crystal phosphor, wherein
   a plane orientation of an upper plane of the phosphor layer, the upper plane having an area larger than those of side planes, is {111}, and
   a plane orientation of some side planes out of the plurality of side planes is {1-10}.

2. The wavelength conversion member according to claim 1, further comprising:
   a transparent layer connected with a bottom plane that faces the upper plane, wherein
   the transparent layer is formed of a transparent single crystal, and
   a plane of the transparent layer, the plane having a plane orientation of {1-100}, is parallel with a side plane of the phosphor layer, the side plane having a plane orientation of {1-10}.

3. The wavelength conversion member according to claim 1, wherein
   a coating that reflects the excitation light is applied on the upper plane.

4. A light emitting device comprising:
   a wavelength conversion member according to claim 1.

5. A wavelength conversion member that converts a wavelength of an excitation light output from an excitation light source, the wavelength conversion member comprising:
   a phosphor layer formed of a single crystal phosphor, wherein
   a plane orientation of an upper plane of the phosphor layer, the upper plane having an area larger than those of side planes, is {001}, and
   a plane orientation of some side planes out of the plurality of side planes is {110}.

6. The wavelength conversion member according to claim 5, further comprising:
   a transparent layer connected with a bottom plane that faces the upper plane, wherein
   the transparent layer is formed of a transparent single crystal, and
   a plane of the transparent layer, the plane having a plane orientation of {1-100}, is parallel with a side plane of the phosphor layer, the side plane having a plane orientation of {110}.

7. The wavelength conversion member according to claim 5, wherein
   a coating that reflects the excitation light is applied on the upper plane.

8. A light emitting device comprising:
   a wavelength conversion member according to claim 5.

* * * * *